(12) United States Patent
Koike et al.

(10) Patent No.: US 6,600,653 B2
(45) Date of Patent: Jul. 29, 2003

(54) ELECTRONIC VEHICLE CONTROL UNIT

(75) Inventors: Tatsuo Koike, Kakuda (JP); Mitsuhiro Ito, Takanezawa-machi (JP)

(73) Assignee: Keihin Corporation, Tokyo (JP)

( * ) Notice: Subject to any disclaimer, the term of this patent is extended or adjusted under 35 U.S.C. 154(b) by 0 days.

(21) Appl. No.: 10/124,478

(22) Filed: Apr. 18, 2002

(65) Prior Publication Data

US 2002/0154486 A1 Oct. 24, 2002

(30) Foreign Application Priority Data

Apr. 19, 2001 (JP) ........................................ 2001-121174

(51) Int. Cl.⁷ ................................................. H05K 7/20
(52) U.S. Cl. ................... 361/704; 123/41.31; 174/52.3; 361/719
(58) Field of Search ................................ 257/707, 706, 257/713, 718, 719, 726, 727; 180/65, 8; 123/198 E, 41, 31; 174/16.3, 252, 52.3, 59; 361/690, 704, 705, 707–712, 717–719; 439/485, 487; 165/80.3, 185

(56) References Cited

U.S. PATENT DOCUMENTS

| | | | | |
|---|---|---|---|---|
| 4,072,378 A | * | 2/1978 | Lochbrunner et al. | 439/370 |
| 5,207,186 A | * | 5/1993 | Okita | 123/41.31 |
| 5,979,393 A | * | 11/1999 | Iino | 123/198 E |
| 6,028,770 A | * | 2/2000 | Kerner et al. | 361/704 |
| 6,219,247 B1 | * | 4/2001 | Haupt et al. | 361/707 |
| 6,396,692 B1 | * | 5/2002 | Farshi et al. | 361/690 |

FOREIGN PATENT DOCUMENTS

| | | |
|---|---|---|
| JP | 6-52831 | 7/1994 |
| JP | 8-169284 | 7/1996 |

* cited by examiner

*Primary Examiner*—Gerald Tolin
(74) *Attorney, Agent, or Firm*—Armstrong, Westerman & Hattori, LLP

(57) ABSTRACT

An electronic control unit (10) mounted in a vehicle engine compartment, having a plastic case body (14), metal collars (32) each molded into the plastic case body, a metal base (12) having bolt through-holes (28) prepared in the same number of the metal collars such that a bolt passes through each metal collar and one of the holes corresponding thereto, and a heat-generating component (18) mounted on the base. The characteristic features are that an outer surface of each metal collars (32) that comes in contact with the plastic case body (14) is formed with projections and depressions, each metal collar (32) is shaped to be protruded from the upper and lower ends of the plastic case body in the same direction as the bolt-through hole (28), and the plastic case body (14) and the metal base (12) are joined together with adhesive (40) in such a way that the metal collars and the metal base are fastened together with the bolts to be mounted in the engine compartment, thereby ensuring good mounting strength with superior watertightness.

7 Claims, 6 Drawing Sheets

ELECTRONIC VEHICLE CONTROL UNIT

BACKGROUND OF THE INVENTION

1. Field of the Invention

This invention relates to an electronic control unit for vehicles and more particularly, to the structure of the electronic control unit for vehicles.

2. Description of the Related Art

Electronic control units conventionally located in the vehicle cabin are now more often being installed in the engine compartment of the vehicle in order to reduce cost by shortening the harness for exchanging signals with the unit and also to reduce the effect of noise on other electrical equipment.

Since the engine compartment is a hotter and more humid environment than the cabin, an electronic control unit (hereinafter sometimes referred to simply as an "unit") located there must be highly watertight. Moreover, if the unit houses heat-generating electronic components (heat-generating components), it must also be able to quickly dissipate heat. This led to the development of technologies, such as that taught by Japanese Laid-Open Patent Application Hei 8-169284, for dissipating heat by mounting electronic components directly on a case made from aluminum or other material having good heat dissipation property. In this prior art, however, waterproofing such as by use of an O-ring at the connector portion is necessary because the unit is mounted in the engine compartment.

In another technique developed, the unit and connector are formed as a single integrated plastic case to improve watertightness (waterproof), but the heat generated from heat-generating electronic components cannot be effectively dissipated because no heat sink or other heat-dissipating member is provided.

An attempt has been made to overcome this problem by, as set out in Japanese Patent Publication Hei 6-52831, molding a metal collar integrally into the plastic case and anchoring the collar to a stay etc. by bolts via a metal (aluminum) base.

In the prior art taught by Japanese Patent Publication Hei 6-52831, the unit comprises a plastic case, a metal base and metal collar, each of which has a different coefficient of thermal expansion. As the bolts are liable to loosen by the differences in thermal expansion, a need to ensure more robust mounting strength has been felt.

SUMMARY OF THE INVENTION

Therefore, an object of this invention is to provide an electronic control unit mounted in the engine compartment of a vehicle or other high-heat, high-humidity environment that provides excellent heat dissipation when the unit houses heat-generating electronic components, ensures good mounting strength at the fastening portion, particularly in an engine compartment, and also has superior watertightness.

Further, when an electronic control unit of this kind is located in an engine compartment or other high-heat, high-humidity environment, there is a danger that the unit may be affected by the expansion and contraction of the air sealed inside the case when the change in the ambient temperature is great.

Therefore, another object of this invention is to provide an electronic control unit for vehicles that is not affected by changes in ambient temperature when located in the engine compartment of a vehicle or other high-temperature, high-humidity environment.

In order to achieve the objects, there is provided an electronic control unit mounted in an engine compartment of a vehicle, having at least the case body made of plastic, a plurality of the collars each made from metal and each molded into the plastic case body, a base made of metal and having a plurality of the bolt through-holes prepared in the same number of the metal collars such that a bolt passes through each metal collar and one of the holes corresponding thereto, and the heat-generating component mounted on the base. The characteristic features reside in that the outer surface of each of the metal collars that comes in contact with the plastic case body is formed with projections and depressions, each of the metal collars is shaped to be protruded from the end of the plastic case body in a direction of the bolt-through hole, and the plastic case body and the metal base are joined together with the adhesive in such a way that the metal collars and the metal base are fastened together with the bolts to be mounted in the engine compartment.

BRIEF DESCRIPTION OF THE DRAWINGS

These and other objects and advantages of the invention will be more apparent from the following description and drawings, in which.

DETAILED DESCRIPTION OF THE PREFERRED EMBODIMENT

Figure 1:
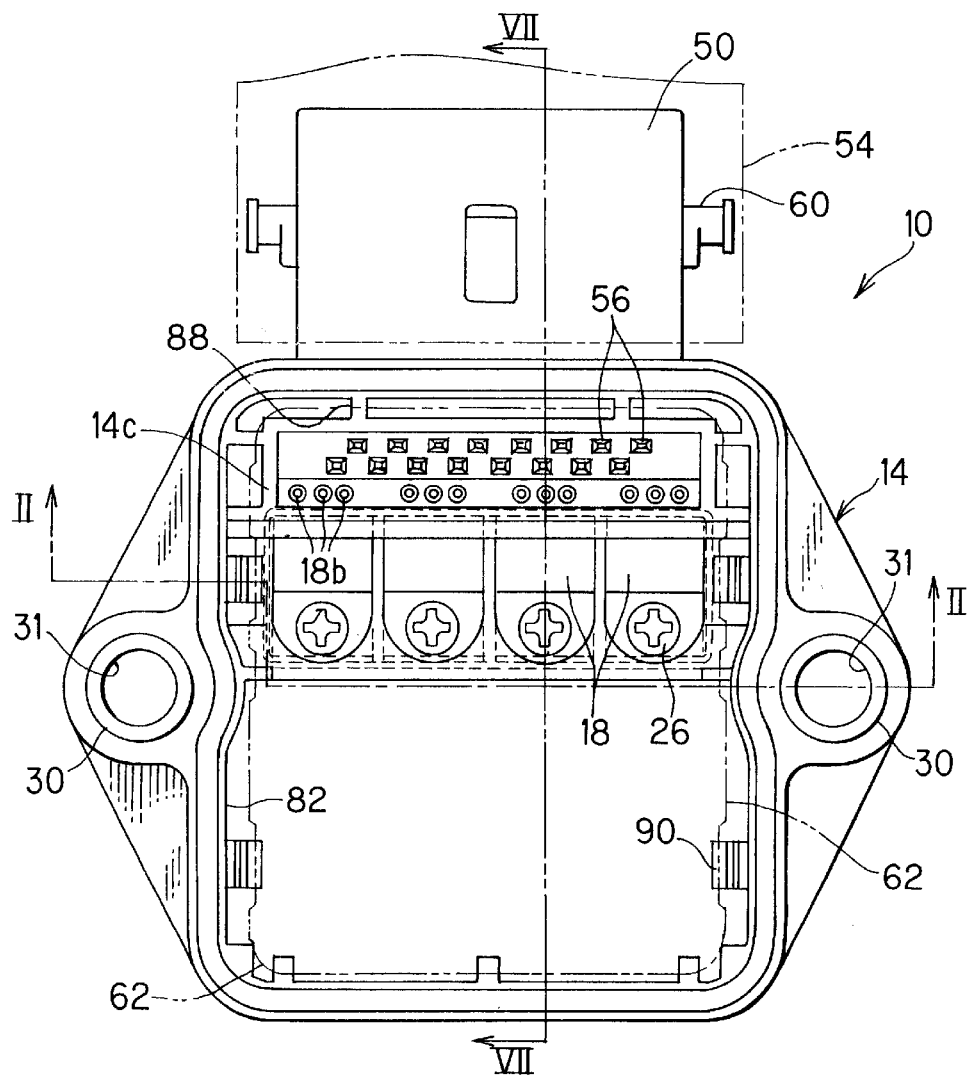
FIG. 1 is a plan view for explaining an electronic control unit for vehicles according to an embodiment of this invention.

An electronic control unit for vehicles according to an embodiment of the invention is described below with reference to the attached drawings. The electronic control unit of this embodiment is mounted in the engine compartment of the vehicle, which is not shown in the drawings, and more specifically on the wall of the compartment or an air intake pipe of the engine.

Figure 2:
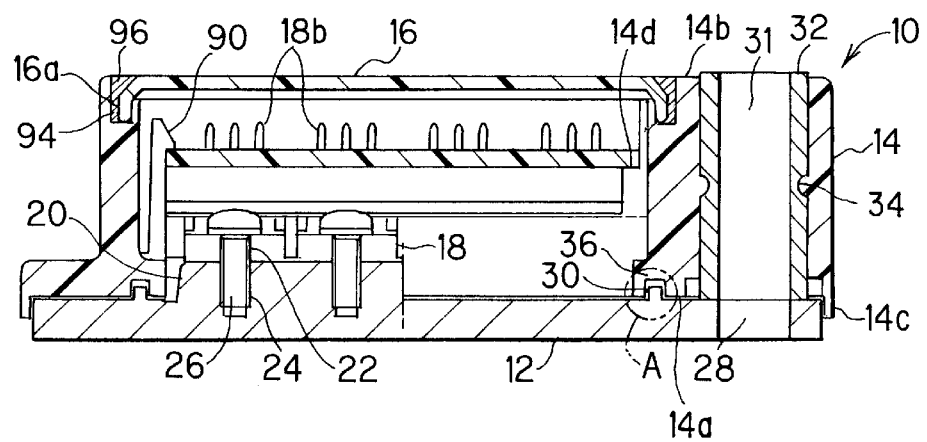
FIG. 2 is a cross-sectional view taken along II—II in FIG. 1.

FIG. 1 is a plan view for explaining the electronic control unit 10 (hereinafter "unit 10") of the embodiment, and FIG. 2 is a cross-sectional view taken along II—II in FIG. 1.

The unit 10 comprises a plastic case body, metal collars molded into the plastic case body, and a metal base having bolt through-holes and whereon heat-generating components are mounted. The outer surface of each metal collar where it comes in contact with the plastic case body is formed with irregularities (projections and depressions) and is also formed such that it protrudes from the plastic case body in the direction of bolt insertion. Further, in addition to assembling the plastic case body and metal base together with adhesive, the metal collars and metal base are fastened together with bolts so as to form an unitary body.

To be more specific, the unit 10 is equipped with a base (metal base) 12 made from aluminum or other metal with high heat dissipation property that functions as a heat sink, a case (plastic case) body 14 made from plastic with openings on the top and bottom and whose bottom side 14a is mounted on the base 12, and a cover 16 (not shown in FIG. 1) made from plastic whose outer edge (described later) is formed in such a way that it fits in a groove (described later) formed in the periphery of the top side 14b of the case body 14.

As shown in FIG. 2, the base 12 is almost formed as a flat plate that, at a portion where it makes contact with heat-generating electronic components, more specifically power transistors (heat-generating components) 18, is formed with a heat-generating component-mounting member 20 of mesa-like shape as viewed from the side.

The heat-generating component-mounting member 20 is formed with four bolt-through holes 24 (only two shown) aligned with power transistor mounting holes 22 formed in four power transistors 18. The four power transistors 18 are mounted by inserting bolts 26 in the bolt holes 24.

The base 12 is formed at locations below the collars described below with bolt through-holes 28 through which bolts (described below) for mounting the unit 10 pass. A protrusion, more specifically a rib-shaped protrusion 30, is formed around the entire periphery of each of the through-holes 28. The configuration of the protrusion 30 is described below. It should be noted that, in this specification, "upper" and "lower" are defined relative to the case body as viewed in FIG. 2, i.e., upper means toward the cover 16 and lower means toward the base 12 in the same figure.

The upper surface of the case body 14 is generally hexagonal and the interior space thereof is roughly rectangular. The case body 14 is molded of polybutylene terephthalate (PBT) or other plastic material.

Generally cylindrical collars 32 made from metal and having bolt through-holes 31 are molded into the material of the case body 14 outside and near the middle of two opposing sides of the roughly rectangular shape of the case body 14 so as to be unitary with the case body 14. The base metal side bolt through-holes 28 and the collar side bolt through-holes 31 are disposed in aligned locations such that the bolts mentioned below can pass through them.

Figure 3:
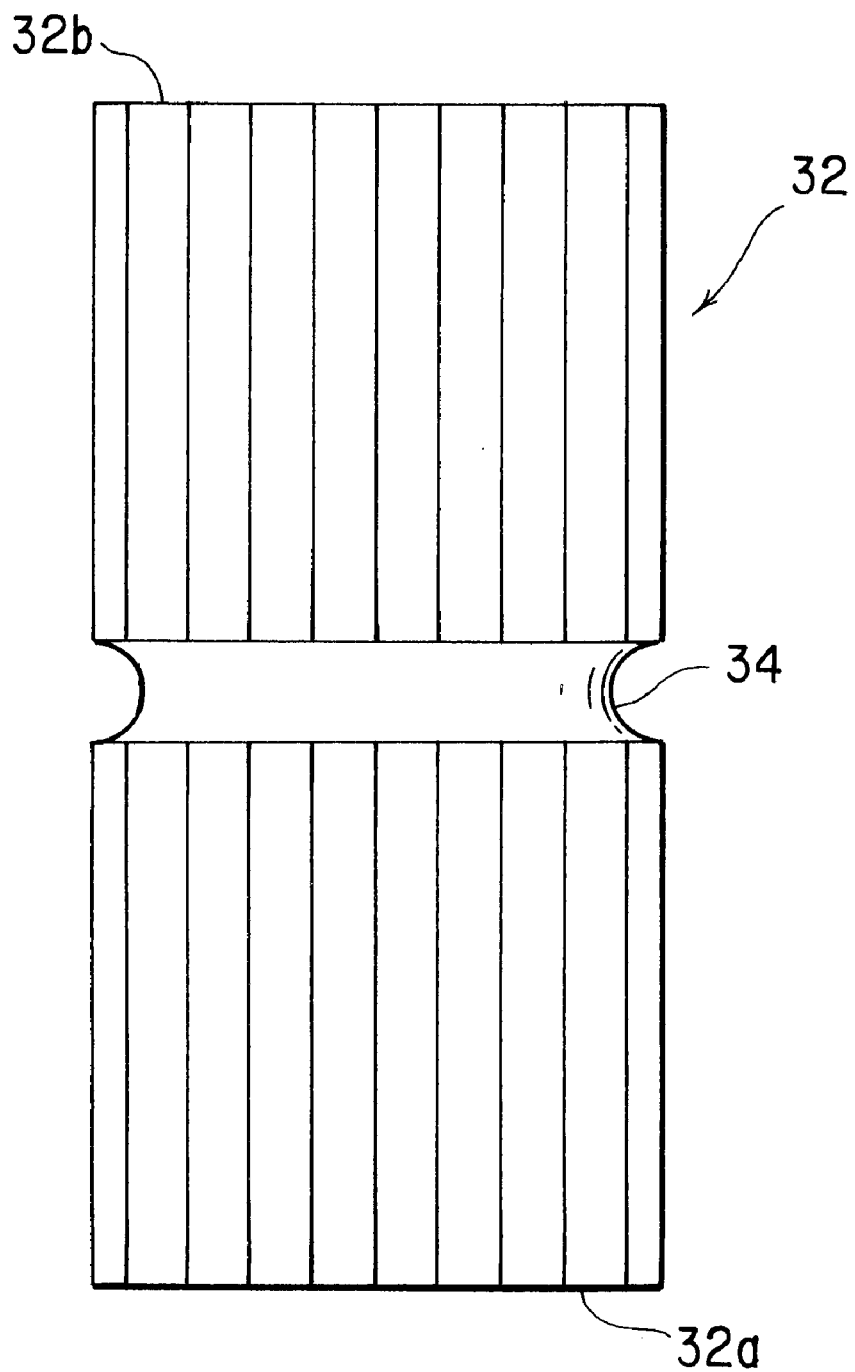
FIG. 3 is an enlarged side view of the collar shown in FIG. 1.

FIG. 3 is a side view of one of the collars 32. As is shown in this figure, the collar 32 is formed on its outer surface that comes in contact with the case body 14 with projections and depressions. More specifically, as shown in FIG. 3, a groove 34 for preventing the collar from slipping out is formed horizontally in the collar 32 at a suitable location near the middle of the collar in the vertical direction (direction of bolt insertion) and straight knurling is formed in the vertical direction (direction of bolt insertion).

By forming the retaining groove 34 on the outer surface of the collar 32, the collar 32 is prevented from coming out of the case body 14 in the direction the bolt is inserted after the bolt has been tightened, even if the unit 10 is subjected to vibration or there is an ambient temperature change that causes the various parts to expand or contract. Further, by forming the straight knurling in the outer surface of the collar 32, the collar 32 is prevented from turning inside the case body 14 after the bolt has been tightened.

In this embodiment, straight knurling is formed on the outer surface of the collar 32 together with the retaining groove 34. Alternatively, hatched knurling, for example, can be formed on the outer surface of the collar 32 without forming the retaining groove 34. This configuration also prevents turning of the collar 32 in the case body 14 and prevents the collar 32 from slipping out of the case body 14 in the direction the bolt is inserted.

Figure 4:
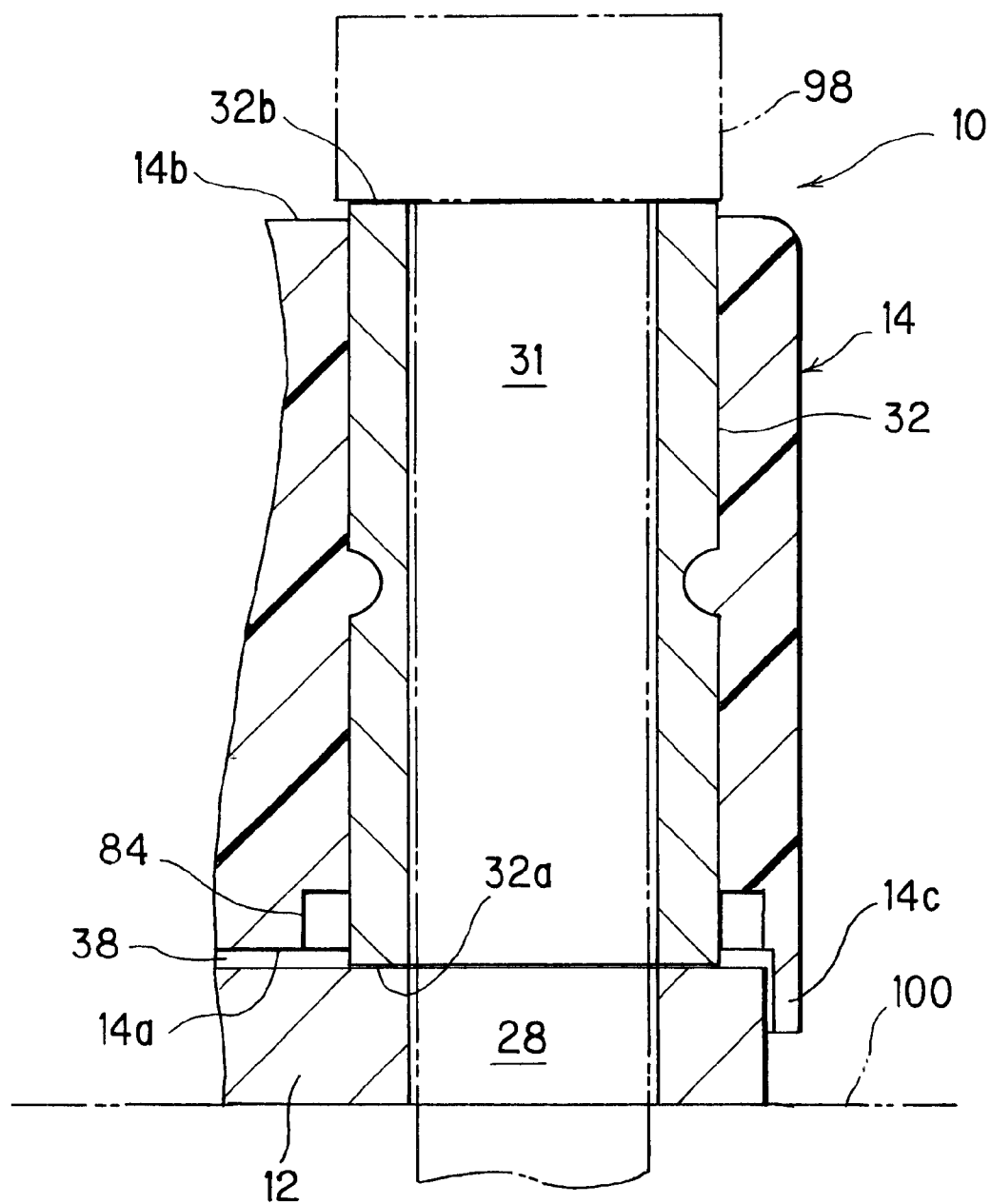
FIG. 4 is an enlarged partial cross-sectional view of the vicinity of the collar shown in FIG. 2.

FIG. 4 is an enlarged cross-sectional view of the area around the collar 32 shown in FIG. 2.

As shown in the drawing, the collar 32 is molded into the case body 14 such that it protrudes, say, 0.2 to 0.5 mm from the bottom side 14a and top side 14b of the case body 14 and is configured such that the bottom end 32a of the collar 32 comes in direct contact with the base 12 and the top end 32b comes in direct contact with the bolt 98. By this means, it is possible to assemble the unit 10 using only metal components and to ensure high thermal shock resistance and assembly strength of the fastener member, especially in the engine compartment.

An outer wall member 14c shaped like a skirt is formed around the bottom side 14a of the case body 14. This makes it difficult for oil, water, dust, etc., to come in contact with adhesive 40 (shown in FIG. 5) present between the case body 14 and the base 12, thus further improving the reliability of the adhesion.

In the unit 10, a groove is formed in either the case body 14 or the base 12, and a protrusion that enters the groove but leaves a prescribed gap therein is formed on the other member in a location corresponding to the groove. The configuration of the protrusion and groove will now be described with reference to FIG. 5.

Figure 5:
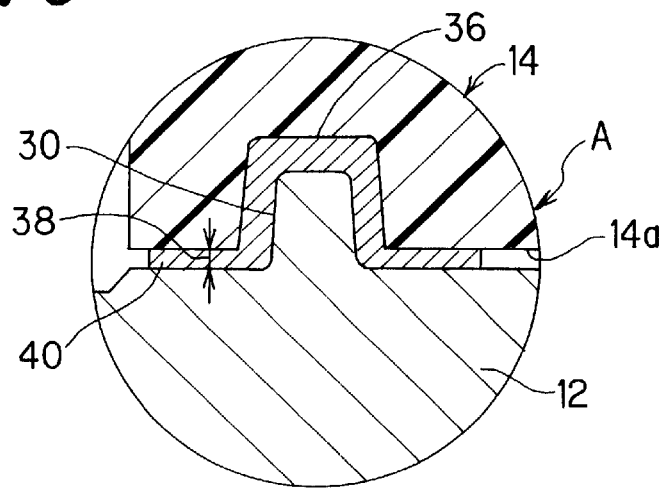
FIG. 5 is an enlarged partial cross-sectional view showing an enlargement of the part indicated by A in FIG. 2.

FIG. 5 is an enlarged cross-sectional view showing an enlargement of the part indicated by A in FIG. 2. As shown in the figure, a groove 36 is disposed in a ring shape at a suitable location (described below) on the lower surface of the bottom side 14a of the case body 14. A corresponding rib-shaped protrusion 30 is disposed around the entire periphery of the base 12. The protrusion 30 is inserted in the groove 36 such that there remains a gap 38 equivalent to the length by which the collar 32 protrudes below the bottom side 14a of the case body 14. In other words, the gap 38 measures 0.2 to 0.5 mm.

By inserting the protrusion 30 in the groove 36 when the unit 10 is assembled, the adhesive 40 applied (injected) in the groove 36 is forced out toward the bottom side 14a in the left and right directions.

When a prescribed gap is formed between the case body 14 and the base 12 at the time of assembling the unit 10, the watertightness (seal efficiency) and adhesion strength may be adversely affected if the gap is not filled with sufficient adhesive 40.

However, in this embodiment, when the base 12 is installed on the case body 14, the protrusion 30 is inserted with a specified gap 38 remaining in the groove 36 wherein the adhesive 40 has been applied. As a result, the adhesive 40 is forced out of the groove 36 into the gap 38 to thoroughly fill the gap 38. Therefore, in addition to achieving watertightness (sealing performance), the adhesion area can be enlarged to improve the adhesion strength. An adhesive overflow member (described below) is provided to prevent the adhesive 40 from reaching the location where the base 12 and collar 32 come in contact.

The collars 32 and base 12 are fastened together by the bolts 98 passing through the bolt through-holes disposed in them, whereby the unit 10 is united together as a single unit.

Figure 6:
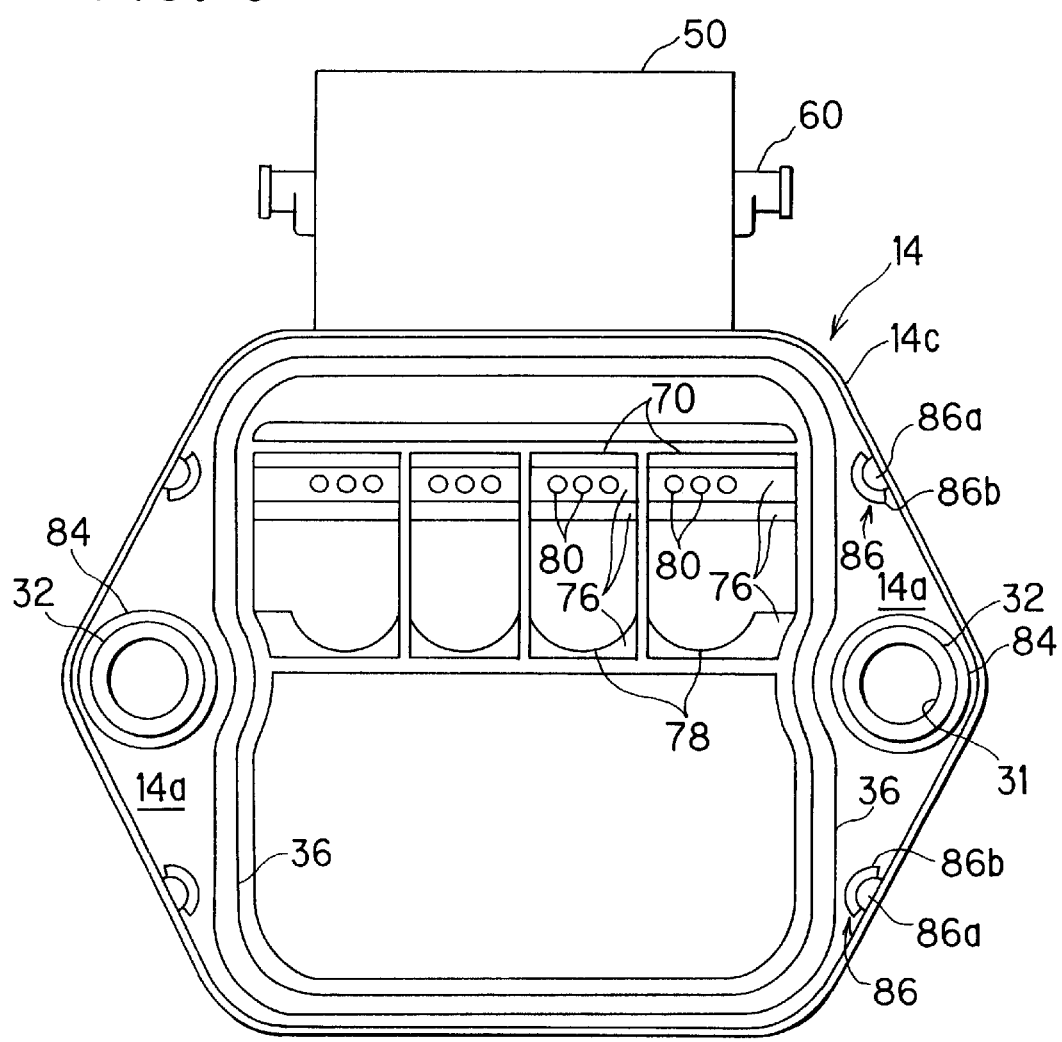
FIG. 6 is a bottom view of the case body shown in FIG. 1.

FIG. 6 is a bottom view seen from the bottom of the case body 14, and as shown in the figure, the groove 36 is formed around the entire periphery of the bottom side 14a of the case body 14. Though not shown in the figure, the base 12 has the associated protrusion 30 formed around its entire periphery.

In order to further improve the watertightness of the unit 10, the connector cavity and terminal are formed integrally with the case body 14 and a vent that connects the inside of the plastic case body 14 with the outside is formed at the connector cavity. This configuration is explained in detail below with reference to FIG. 7 etc.

Figure 7:
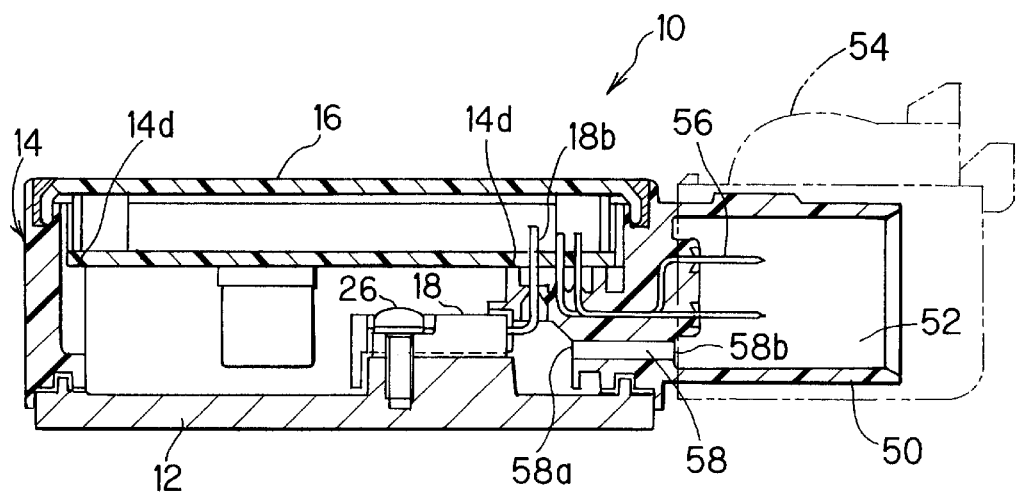
FIG. 7 is a cross-sectional view taken along VII—VII in FIG. 1.

FIG. 7 is a cross-sectional view taken along VII—VII in FIG. 1.

As shown in this figure and FIGS. 1 and 6, a connector member 50 is integrally molded with the case body 14. The connector member 50 is made open at one end and forms a connector cavity 52. A terminal 56 for connecting a printed circuit board (described below) housed in the unit 10 and a connector (indicated by imaginary lines) is molded integrally with the case body 14 so as to protrude into the connector cavity 52.

Figure 8:
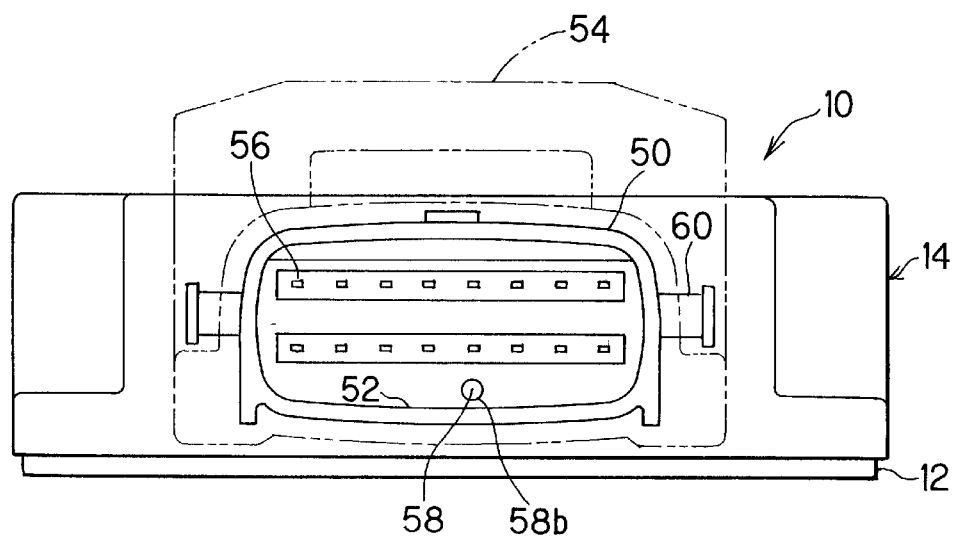
FIG. 8 is a side view of the unit shown in FIG. 1 viewed from the connector (opening)

FIG. 8 is a side view of the unit 10 shown in FIG. 1 seen from the opening side of the connector cavity 52. As shown in FIGS. 7 and 8, a vent 58 that connects the inside of the case body 14 with the outside, i.e., the housing part and the connector cavity 52, is formed in the connector cavity 52.

More specifically, a case side opening 58a is formed in the case body 14 below the part where the terminal 56 is integrally molded therewith and a connector side opening 58b is formed in the wall at the back of the connector cavity 52, thereby forming the vent 58 by the connection of these two openings More specifically, when the air in the unit 10 expands, air flows out of the unit 10 into the connector member 50 through the vent 58 and passes through the inside of the harness (not shown) connected to the connector 54, thereby escaping into the cabin (not shown) or other area with a relatively favorable environment. Further, when the air in the unit 10 contracts, air from the cabin etc. flows into the unit 10 via the same route in the opposite from that when the air expands. Therefore, even under conditions of severe ambient temperature change, the unit 10 is not affected in spite of the high sealing performance of its structure. Even when the case body 14 and cover 16 are joined using a thermal hardening adhesive, air passage between the inside and outside of the unit 10 is possible.

A protrusion 60 (shown in FIGS. 1, 6 and 8) for engaging the connector 54 is disposed at an appropriate location on the wall of the connector member 50, and by means of a suitable engagement structure (not shown) disposed on the side of the connector 54, the connector 54 can be connected to and disconnected from the connector member 50.

Further, as shown in FIGS. 1 and 2, the top side 14b of the case body 14 is molded almost flat, and power transistor bays (described below) capable of holding the power transistors 18 are formed inward of the bottom side 14a.

A printed circuit board 62 mounted with various electronic components is housed inside the unit 10. Leads 18b of the power transistors 18 are connected to the printed circuit board 62. The harness (not shown) is connected to the printed circuit board 62 via the connector 54 to enable the printed circuit board 62 to exchange signals with external units. As the interconnections for enabling such exchange of signals are unrelated to the present invention, they are not explained here.

Figure 9:
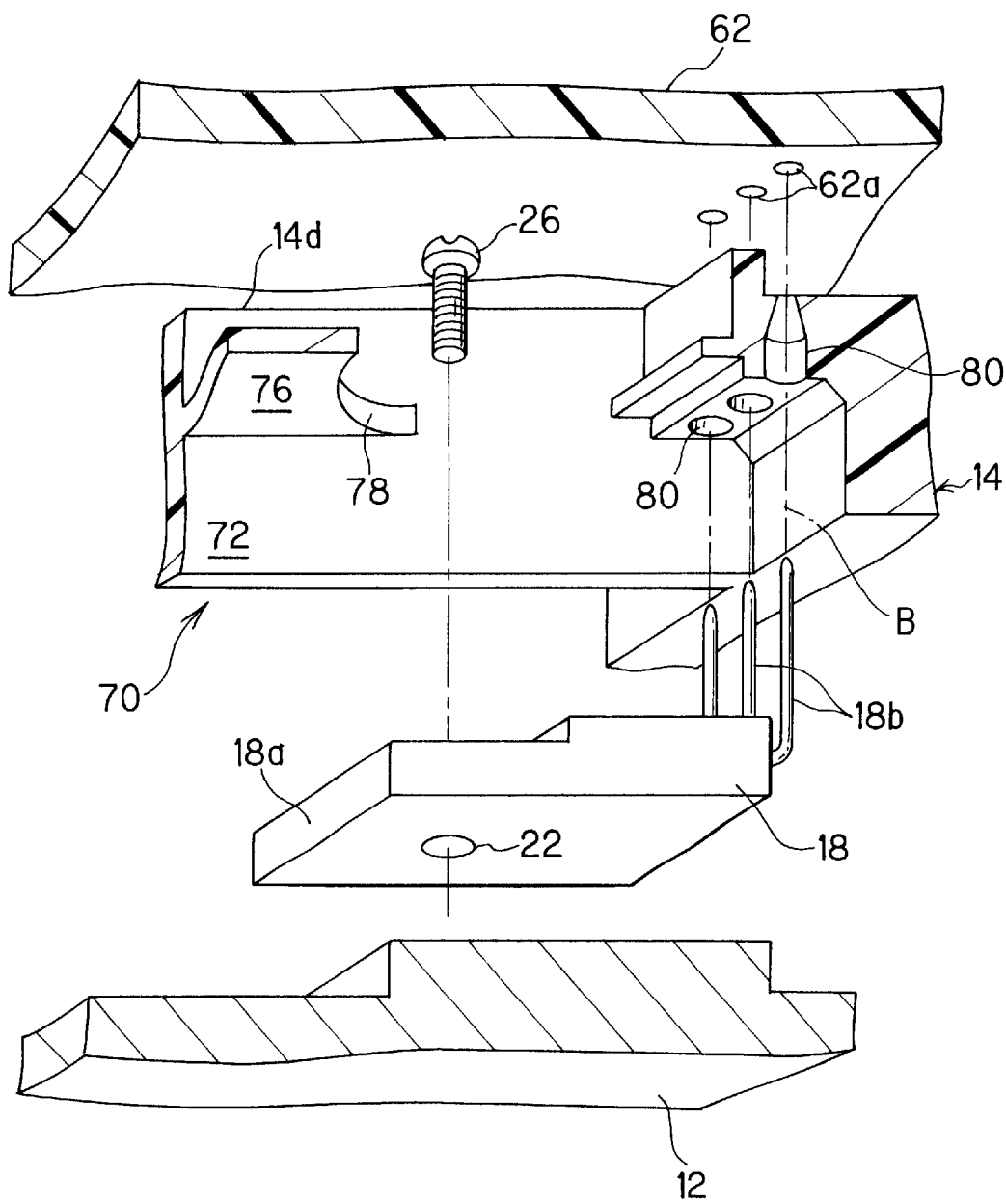
FIG. 9 is a perspective view showing part of the unit shown in FIG. 1 for explaining a step for housing a power transistor in the case body.

The assembly of the unit 10 is explained below with reference to FIG. 9 etc. FIG. 9 is a perspective view showing part of the unit 10 shown in FIG. 1 for explaining a step for housing the power transistors 18 in the case body 14.

First, the power transistors 18 are placed in the case body 14.

In the case body 14, four power transistor bays (recessed holding spaces; only one shown in figure) 70 about the same size as the power transistors are formed where the power transistors 18 are mounted.

The power transistor bays 70 are each formed in the general shape of a bathtub toward the bottom of the case body 14. A power transistor contact surface 76, which is part of the wall of the power transistor bay 70, has an open area 78, formed as a rectangular notch rounded at one end, that communicates the top and bottom portions of the case body 14 and through which a bolt 26 and tool (screwdriver) are passed when bolting the power transistor 18 to the base 12.

In each power transistor bay, a step-off is formed in part of the power transistor contact surface 76, and three lead holes 80 through which the leads 18b of the power transistor 18 can be inserted are formed in this step-off. The case body 14 is formed with a circuit board mounting member 14d (shown in FIGS. 2, 7 and 9) for mounting the printed circuit board 62.

The lead holes 80 are formed in a location where the leads 18b extending from the power transistor 18 can be inserted in them when the main body 18a of the power transistor 18 is housed in the power transistor bay 70.

A description of the relative positions etc. of the base 12, case body 14, power transistors 18, and printed circuit board 62 is continued below.

The unit 10 comprises at least the base (made from metal) 12 to which the power transistor (heat-generating component) 18 are fastened, the case body 14 (made from plastic) attached to the base, and the printed circuit board (circuit board) 62 to which the leads 18b extending from the power transistors 18 are connected. The unit 10 is configured such that the power transistor bays 70 where the power transistors 18 are housed are formed in the case body 14, lead holes 80 are disposed in the wall 76 (power transistor contact surface) forming the power transistor bays 70, and the leads 18b pass through the lead holes 80.

The base 12, case body 14, and printed circuit board 62 are disposed in the unit 10 in three layers. More specifically, the case body 14 is disposed in the middle, the printed circuit board 62 is disposed above it, and the base 12 on which the power transistors 18 are secured is disposed below it. The power transistor bays 70 are formed as recesses and therefore do not add to the height of the unit 10.

First, the power transistors 18 are housed in the case body 14, and then adhesive 40 is applied (injected) to a suitable location on the bottom edge 14a of the case body 14, or more specifically around the entire groove 36 in the case body 14.

The case body 14 (bottom side 14a) is then mounted on the base 12. More specifically, it is mounted such that the protrusion 30 on the base 12 is inserted in the groove 36 formed in the case body 14.

As noted above, the adhesive 40 applied (injected) in the groove 36 is forced toward the inside and outside of the case body 14, i.e., left and right directions in FIG. 5, when the protrusion 30 is inserted, thus causing an appropriate amount to be forced out and fill the gap 38. More specifically, in order to achieve the thickness of the adhesive 40, i.e., the gap 38, necessary to ensure adhesion strength between the case body 14 and the base 12, the collar 32 is molded such that it extends a suitable distance below the case body 14. As a result, the gap 38 is filled with adhesive 40 and the adhesion strength is improved. A silicon type adhesive capable of absorbing expansion and contraction is used as the adhesive 40.

As shown in FIG. 4, the portion of the case body 14 around the bottom edge of the collar 32 molded into the case body 14 is formed with a step-off to provide an adhesive overflow area 84. The adhesive overflow area 84 effectively prevents the adhesive 40 from reaching the bottom edge 32a of the collar 32.

When the base 12 is mounted on the case body 14, the collars 32 protruding at two locations act as pivot points, which can cause part of the base 12 to move vertically and prevent accurate assembly. For this reason, as shown in FIG. 6, four base mounts 86 are formed at appropriate locations on the bottom edge 14a of the case body 14.

Each base mount 86 comprises a protrusion 86a and a groove 86b. The protrusion 86a is formed so that it protrudes in the height direction (direction of bolt insertion into the bolt through-holes 28 and 31) by about the same amount (0.2 to 0.5 mm) that the bottom edge 32a of the collar 32 protrudes below the bottom edge 14a of the case body 14. The groove 86b is formed in a shape similar to the adhesive overflow area 84 disposed on the bottom side of the collar 32 and functions similarly. That is, it helps to prevent the adhesive 40 from reaching the bottom of the protrusion 86a.

As shown in FIG. 6, the groove 86b does not extend to the outer wall 14c. If the groove 86b were configured such that it came in contact with the outer wall 14c, it would form a relatively large thin-wall area, which would be susceptible to under-fill (so-called "short shot") during plastic molding.

Next, bolts (not shown) for temporarily holding the unit 10 are passed through the bolt through-holes 28 and 31 in the collars and the base 12, and then nuts are used to tighten the collars 32 (i.e., the case body 14) and base 12 together.

Hardening of the adhesive 40 in this condition completes adhesion of the base 12 to the case body 14.

Next, the bolts 26 are inserted in the power transistor mounting holes 22 and the bolt holes 24 (not shown in FIG. 9) through the open area 78, whereby the power transistors 18 are fastened to the base 12.

After the base 12 has been fastened (bolted) to the case body 14, the printed circuit board 62 is inserted through the opening formed in the top side 14b of the case body 14. The inserted circuit board 62 is lowered along multiple circuit board guide ribs 88 formed at suitable locations on the inside wall 82 (shown in FIGS. 1 and 2) of the case body 14. The circuit board is then pushed down from above. As it descends, it spreads circuit board retainers 90 of hook-like shape as seen from the side (shown in FIGS. 1 and 2). The lowering is continued until the circuit board makes contact with the circuit board mounting member 14d of the case body 14, whereupon the circuit board retainers 90 snap back to their original shape to secure the printed circuit board 62 in place.

In the unit 10, second lead holes 62a (FIG. 9) continuing from the lead holes 80 are formed in the printed circuit board 62, and the leads 18b pass through the second lead holes 62a.

More specifically, the lead holes (second lead holes) 62a formed in the circuit board 62 are disposed in a location (indicated by a dashed line B in FIG. 9) where the leads 18b can pass through the lead holes 62a and lead holes 80 when the main body 18a of the power transistor 18 is housed in the associated power transistor bay 70, and the printed circuit board 62 is secured on the circuit board mounting member 14d.

In other words, the leads 18b protruding from the case body 14 are guided such that they also pass through the lead holes 62a disposed in the printed circuit board 62. Therefore, the leads 18b and lead holes 62a can be easily aligned.

When electronic components having leads are mounted in a prior art case (unit) that houses a circuit board, alignment has to be performed when connecting leads to the circuit board. As this makes it necessary to use jigs or to align the leads manually, it lowers work efficiency.

This embodiment is configured such that the case body 14 has power transistor bays 70 patterned in the shape of the power transistors 18, and when a power transistor main body 18a is housed there, the leads 18b pass through the lead holes 80. With this, alignment of the leads 18b is achieved merely by housing the power transistor 18 in the power transistor bay 70, thus improving work efficiency during assembly of the unit 10.

Next, soldering, etc., is used to connect the leads 18b and the printed circuit board 62, and the cover 16 (shown in FIGS. 2 and 7) is attached from above. The edge 16a of the cover 16 is formed such that it extends downward as shown in the figures, and the part that extends downward fits in a cover holder groove 94 formed around the entire periphery of the upper edge 14b of the case body 14.

Next, a silicon adhesive 96 is applied (injected) in the remaining area (gap) between the inserted edge 16a and cover holder groove 94, the cover 16 is forced down from above by means of a weight etc. not shown in the figure, and the adhesive 96 is hardened by heating the periphery.

The bolts and nuts used for temporarily holding the assembled unit 10 are removed and the unit 10 is fastened by means of anchor bolts 98 either directly or via a stay to the unit-mounting member 100 (shown in FIG. 4) made from a metal material and located at a suitable location in the engine compartment of the vehicle; e.g., the compartment wall surface or the engine intake pipe, and then the connector 54 is connected. In the above process, the base 12 may be mounted on the case body 14 after the power transistors 18 are first bolted to the base 12.

As described above, in this embodiment the collars 32 molded integrally into the case body 14 are formed with projections and depressions at their outside surfaces coming in contact with the case body 14. Therefore, even if the unit 10 is subjected to vibration after it is tightened down with bolts or the different portions of the unit 10 are subjected to expansion or contraction caused by ambient temperature changes, the collars 32 will not slip out of the case body 14 in the direction the bolts are inserted.

Further, since a configuration is used wherein the collars 32 and base 12 are integrally fastened either directly or via a stay to the unit-mounting member 100 or other suitable location on the compartment wall or engine intake pipe, sufficient heat dissipation is achieved in addition to ensuring the mounting strength of the attachment member in the engine compartment and achieving superior watertightness.

The groove-shaped depression 36 is formed in one of the surfaces of the adhered base 12 and case body 14 (in the case body in the foregoing embodiment) and the continuous rib-shaped protrusion 30 is formed on the other surface (the base). The protrusion 30 is configured such that a gap 38 is formed when inserted in the groove 36. Therefore, when the case body 14 and base 12 are joined, the protrusion 30 spreads out the adhesive 40, thus thoroughly filling the gap 38 and ensuring excellent watertightness (sealing performance) and adhesion strength. Moreover, the spreading of the adhesive 40 expands the adhesion area to further improve the adhesion strength.

Since the inside of the unit 10 is communicated with the outside by the vent 58 disposed in the connector cavity 52, air is not sealed inside the unit 10. Therefore, even in environments with severe ambient temperature changes, such as in the engine compartment of a vehicle, the case is not affected.

As explained in the foregoing, this embodiment of the present invention is configured to provide an electronic control unit (10) mounted in an engine compartment of a vehicle, having at least the case body (14) made of plastic, a plurality of the collars (32) each made from metal and each molded into the plastic case body, a base (12) made of metal and having a plurality of the bolt through-holes (28) prepared in the same number of the metal collars such that a bolt passes through each metal collar and one of the holes corresponding thereto, and the heat-generating component (18) mounted on the base. The characteristic features reside in that the outer surface of each of the metal collars (32) that comes in contact with the plastic case body (14) is formed with projections and depressions, each of the metal collars (32) is shaped to be protruded from the end of the plastic case body in the direction of the bolt-through hole (28), and the plastic case body (14) and the metal base (12) are joined together with the adhesive (40) in such a way that the metal collars and the metal base are fastened together with the bolts to be mounted in the engine compartment.

Thus, the outside surface of each metal collars, which is molded into the plastic case body, that comes in contact with the plastic case body is formed to have projections and depressions, whereby it is prevented from turning inside the case body and from slipping out of the plastic case body in the direction of bolt insertion, and by this means the collar is prevented from coming out of the plastic case body.

Further, each metal collar is formed such that it protrudes from the plastic case body in the direction of bolt insertion, the plastic case body is configured such that it is mounted on the metal base by means of adhesive, the metal collar and metal base are tightened together by means of the bolt, and the unit is mounted in the engine compartment, and it is therefore possible to fasten it to a metal member in the engine compartment and the structure for vehicle electronic control units can be reliably secured without being affected by expansion or contraction of the plastic case body or adhesive due to changes in the ambient temperature. Not only is the unit ensured of good mounting strength, it also has superior watertightness.

In the unit, one of the plastic case body (14) and the metal base (12) is provided with the groove (36), and the other of the plastic case body (14) and the metal base (12) is provided with the protrusion (30) that fits in the groove while leaving a gap.

With this, when the plastic case body and metal base are joined, the protrusion spreads out the adhesive in the gap between the plastic case body and metal base, and the adhesive can therefore be effectively charged in the gap and sufficient sealing performance (watertightness) and adhesion strength ensured. Moreover, the spreading of the adhesive increases the adhesion area to thereby enhance the adhesion strength.

In the unit, the plastic case body (14) is integrally formed with the connector cavity (52) having the vent (58) that connects inside of the plastic case body with exterior. Since the inside of the unit that houses electronic components is communicated with the outside via the vent formed in the connector cavity integrally molded with the plastic case body, and, therefore, the unit is not affected by changes in the ambient temperature even when it is installed in a high-temperature, high-humidity environment such as the engine compartment of a vehicle.

In the unit, each of the metal collars (32) is shaped to be protruded from the upper end (14b) of the plastic case body (14) in the direction of the bolt-through hole (28). More precisely, each of the metal collars (32) is shaped to be protruded from the upper end (14b) and the lower end (14a) of the plastic case body (14) in the direction of the bolt-through hole.

In this embodiment, the number of heat-generating components, i.e., power transistors 18, housed inside the unit 10 and the number of power transistor bays are four each, but the number is not limited to four and can be any suitable number.

The base 12 is made from aluminum but any of various other metal materials that exhibit good heat dissipation can be used instead.

The outside surface of each collar 32 that comes in contact with the case body 14 is configured with a horizontal retaining groove and vertical straight knurling as shown in FIG. 3, but any of various other configurations of the outside surface of the collars 32, such as hatched knurling, that are capable of preventing the collars 32 from slipping out of the case body 14 in the direction of bolt insertion and from turning inside the case body 14 and can be adopted instead.

Further, the protrusion 30 is formed on the base 12 and the groove 36 on the case body 14, but the unit can instead be configured with the protrusion 30 on the case body 14 and the groove on the base 12.

Although it has been explained that at the time of assembling the unit 10, the adhesive is applied to the case body after mounting the power transistors 18, it may instead be applied before they are mounted.

The unit-mounting member 100 is made from a metal material, but it need not be made from a metal material if the unit is mounted in a location where the heat of the power transistors 18 can be dissipated via the base 12 without having an affect on the mounting strength of the unit 10. For example, the unit 10 can be mounted even in an engine air intake pipe made from plastic if the base 12 is exposed inside the intake pipe. The "intake pipe" referred to here is that between the inlet and outlet of the intake air in the engine.

The entire disclosure of Japanese Patent Application No. 2001-121,174 filed on Apr. 19, 2001, including specification, claims, drawings and summary, is incorporated herein in reference in its entirety.

While the invention has thus been shown and described with reference to specific embodiments, it should be noted that the invention is in no way limited to the details of the described arrangements but changes and modifications may be made without departing from the scope of the appended claims.

What is claimed is:

1. An electronic control unit (10) mounted in an engine compartment of a vehicle, having at least a case body (14) made of plastic, a plurality of collars (32) each made from metal and each molded into the plastic case body, a base (12) made of metal and having a plurality of bolt through-holes (28) prepared in a same number of the metal collars such that a bolt passes through each metal collar and one of the holes corresponding thereto, and a heat-generating component (18) mounted on the base;

wherein the improvement comprises:
  an outer surface of each of the metal collars (32) that comes in contact with the plastic case body (14) is formed with projections and depressions,
  each of the metal collars (32) is shaped to be protruded from an end of the plastic case body in a direction of the bolt-through hole (28), and
  the plastic case body (14) and the metal base (12) are joined together with adhesive (40) in such a way that the metal collars and the metal base are fastened together with the bolts to be mounted in the engine compartment.

2. An unit according to claim 1, wherein one of the plastic case body (14) and the metal base (12) is provided with a groove (36), and the other of the plastic case body (14) and the metal base (12) is provided with a protrusion (30) that fits in the groove while leaving a gap.

3. An unit according to claim 1, wherein the plastic case body (14) is integrally formed with a connector cavity (52) having a vent (58) that connects inside of the plastic case body with exterior.

4. An unit according to claim 2, wherein the plastic case body (14) is integrally formed with a connector cavity (52) having a vent (58) that connects inside of the plastic case body with exterior.

5. An unit according to claim 1, wherein each of the metal collars (32) is shaped to be protruded from an upper end (14b) and a lower end (14a) of the plastic case body (14) in the direction of the bolt-through hole.

6. An unit according to claim 2, wherein each of the metal collars (32) is shaped to be protruded from an upper end (14b) and a lower end (14a) of the plastic case body (14) in the direction of the bolt-through hole.

7. An unit according to claim 3, wherein each of the metal collars (32) is shaped to be protruded from an upper end (14b) and a lower end (14a) of the plastic case body (14) in the direction of the bolt-through hole.

* * * * *